(12) United States Patent
Umeyama et al.

(10) Patent No.: US 6,252,457 B1
(45) Date of Patent: Jun. 26, 2001

(54) DIFFERENTIAL AMPLIFIER CIRCUIT

(75) Inventors: Takehiko Umeyama; Toru Takeuchi, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/472,874

(22) Filed: Dec. 28, 1999

(51) Int. Cl.[7] ...................................................... H03F 3/45
(52) U.S. Cl. ............................ 330/252; 330/261; 360/67; 360/68
(58) Field of Search ................................. 330/252, 261; 360/67, 68

(56) References Cited

U.S. PATENT DOCUMENTS

| 5,625,318 | * | 4/1997 | Sevenhans et al. | .................. | 330/252 |
| 5,757,566 | | 5/1998 | Ngo et al. | | |
| 5,942,939 | * | 8/1999 | Finol et al. | ........................... | 330/252 |
| 6,066,987 | * | 5/2000 | Lorenz | .................................. | 330/252 |
| 6,154,333 | * | 11/2000 | Narusawa | .............................. | 330/252 |

FOREIGN PATENT DOCUMENTS

| 1145872 | * | 3/1969 | (GB) | .................................... | 330/252 |

* cited by examiner

*Primary Examiner*—Michael B Shingleton
(74) *Attorney, Agent, or Firm*—McDermott, Will & Emery (57) ABSTRACT

Emitters of a first NPN transistor and a second NPN transistor forming a differential input section are respectively connected to collectors of a third NPN transistor and a fourth NPN transistor; the collectors and bases of the third NPN transistor and the fourth NPN transistor are respectively connected through first and second capacitors; and the bases of the third NPN transistor and the fourth NPN transistor are respectively connected to a first reference power source through first and second resistors.

16 Claims, 7 Drawing Sheets

DIFFERENTIAL AMPLIFIER CIRCUIT

TECHNICAL FIELD

The present invention relates to a differential amplifier circuit and, more particularly, to a differential amplifier circuit for amplifying an ac signal, when a signal source to be amplified is the one in which an ac voltage signal is superimposed on a dc voltage.

BACKGROUND ART

Figure 6:
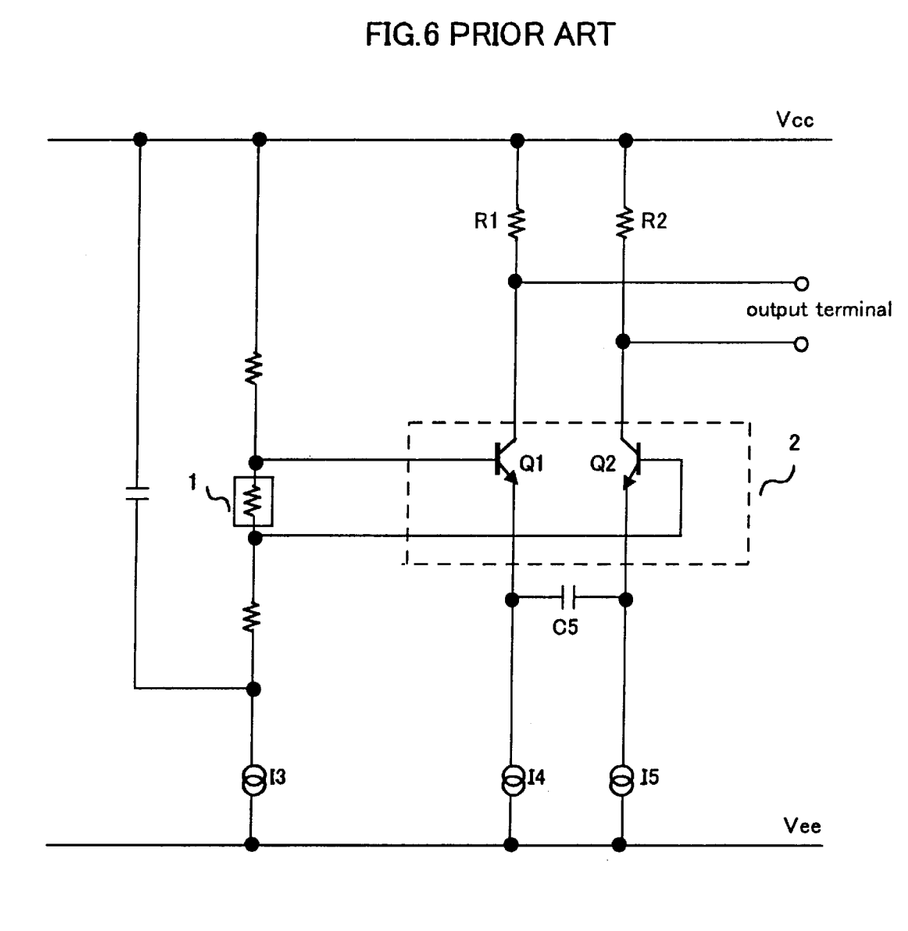
FIG. 6 is a circuit diagram showing a differential amplifier circuit according to the prior art.

FIG. 6 is a circuit diagram showing an example of a differential amplifier circuit according to a prior art. In FIG. 6, reference numeral 1 indicates a signal source in which an ac voltage signal is superimposed on a dc voltage source, and signals on two terminals are respectively inputted to bases of NPN transistors Q1 and Q2 forming a differential input section 2. Further, collectors of the NPN transistors Q1 and Q2 are respectively connected to a first voltage source Vcc through resistors R1 and R2, and emitters are respectively connected to a second voltage source Vee through constant current sources I4 and I5. Furthermore, the emitters of the NPN transistors Q1 and Q2 are connected to each other through a capacitor C5.

Referring to FIG. 6, as a specific example of the signal source 1 in which an ac voltage signal is superimposed on a dc voltage source, a magneto-resistive head (MRH) is known.

In the operation of this conventional differential amplifier circuit, between ac voltage component and dc voltage component on the two terminals of the signal source 1, influence of the dc voltage component is removed by the capacitor C5. And a signal formed by amplifying only the ac voltage component from the collectors of the transistors Q1 and Q2 is outputted from an output terminal.

In the arrangement shown in FIG. 6, supposing that the constant current sources I4 and I5 are respectively 5 mA, it is calculated that to get a lower limit cutoff frequency of 1 MHz in the amplifier circuit, a value of the capacitor C5 mounting to 0.0156 $\mu$F. is required.

This value of 0.0156 $\mu$F. of the capacitor C5 is a so large value that it is difficult to incorporate any ordinary capacitor in a semiconductor integrated circuit. Thus, there is a disadvantage that such a capacitor is obliged to be disposed from outside in the form of an outside part.

Figure 7:
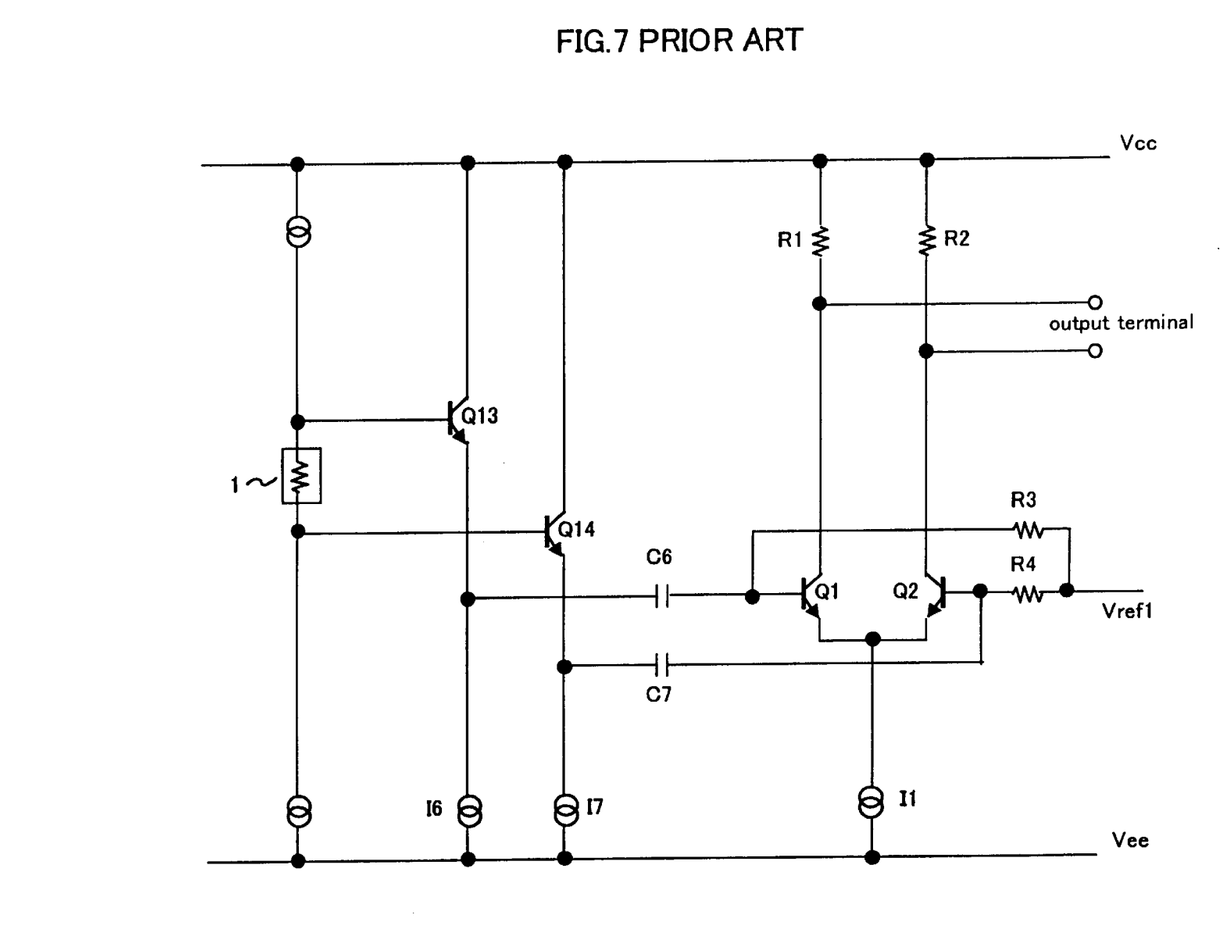
FIG. 7 is a circuit diagram showing a differential amplifier circuit according to the prior art.

To overcome such a disadvantage, as shown in FIG. 7, there has been provided an improved differential amplifier circuit capable of incorporating a capacitor in the semiconductor integrated circuit.

In FIG. 7, two terminals of the signal source 1 are respectively connected to bases of NPN transistors Q13 and Q14. Collectors of the NPN transistors Q13 and Q14 are respectively connected to a first power source Vcc, and their emitters are respectively connected to a second voltage source Vee through constant current sources I6 and I7.

Further, the emitters of the NPN transistors Q13 and Q14 are connected to bases of NPN transistors Q1 and Q2 forming a differential input section through capacitors C6 and C7. Further, collectors of the NPN transistors Q1 and Q2 are respectively connected to the first voltage source Vcc through resistors R11 and R2, and respectively connected to output terminals. Furthermore, emitters of the NPN transistors Q1 and Q2 are connected to each other, and connected to the second voltage source Vee through a constant current source I1.

In the above differential amplifier circuit comprising the NPN transistors Q1 and Q2, between ac voltage component and dc voltage component on the two terminals of the signal source 1, only the ac voltage component is inputted by the capacitors C6 and C7, and therefore an operation for amplifying only the ac voltage component is performed.

In the arrangement shown in FIG. 7, supposing that the constant current source I1 is 10 mA, it is calculated that to get a lower limit cutoff frequency of 1 MHz in the amplifier circuit, values of the capacitors C6 and C7 respectively mounting to 153 pF are required.

This value of the capacitors is a large value of a level making it possible to incorporate the capacitors in a semiconductor integrated circuit.

However, when the capacitors C6 and C7 are incorporated in the semiconductor integrated circuit, to prevent the two terminals of the signal source 1 from being influenced by parasitic capacity component of the capacitors C6 and C7, it is essential to provide the NPN transistors Q13 and Q14 therebetween. Hence there arises a further problem that to reduce noise generated in the NPN transistors Q13 and Q14, a collector current applied to the NPN transistors Q13 and Q14 must be equivalent to that applied to the NPN transistors Q1 and Q2 forming the differential amplifier circuit. In other words, to form a circuit of less noise, a problem exists in that a collector current not less than 5 mA is required for each of the NPN transistor Q1, Q2, Q13 and Q14, which results in considerable power consumption in the entire circuit.

Thus, in the conventional differential amplifier circuit arranged as mentioned above, there exists a problem that it is impossible to incorporate any capacitor in the semiconductor integrated circuit or that even if it is possible to incorporate it, large power consumption is unavoidable.

DISCLOSURE OF THE INVENTION

Accordingly, the present invention was made to solve the above-discussed problems incidental to the prior art, and has an object of providing a differential amplifier circuit of less power consumption capable of incorporating a capacitor or capacitors for removing the dc voltage component of the signal source in the semiconductor integrated circuit.

This object and advantages are achieved by providing a novel and improved differential amplifier circuit for treating a signal in which an ac voltage signal is superimposed on a dc voltage, the differential amplifier circuit according to the invention being characterized in that:

two terminals of a signal source are respectively connected to bases of a first NPN transistor and a second NPN transistor; emitters of the first NPN transistor and the second NPN transistor are respectively connected to collectors of a third NPN transistor and a fourth NPN transistor; emitters of the third NPN transistor and the fourth NPN transistor are commonly connected, and further connected to a first power source through a constant current source; the collectors and bases of the third NPN transistor and the fourth NPN transistor are respectively connected through first and second capacitors; bases of the third NPN transistor and the fourth NPN transistor are respectively connected to a first reference power source through first and second resistors; and collectors of the first NPN transistor and the second NPN transistor are respectively connected to a second power source through third and fourth resistors, and respectively connected to output terminal.

Another differential amplifier circuit for treating a signal in which an ac voltage signal is superimposed on a dc voltage according to the invention includes: plural signal sources; and plural differential input sections formed by connecting two terminals of each signal source respectively to bases of a first NPN transistor and a second NPN transistor in each individual signal source of the plural signal sources; and in which emitters of the plural first NPN transistors and the plural second NPN transistors are commonly connected, and respectively connected to collectors of a third NPN transistor and a fourth NPN transistor; emitters of the third NPN transistor and the fourth NPN transistor are commonly connected, and further connected to a first power source through a constant current source; the collectors and bases of the third NPN transistor and the fourth NPN transistor are respectively connected through first and second capacitors; bases of the third NPN transistor and the fourth NPN transistor are respectively connected to a first reference power source through first and second resistors; and collectors of the plural first NPN transistors and the plural second NPN transistors are commonly connected, and further connected to a second power source through third and fourth resistors, and respectively connected to output terminal.

The above object and novel features of the invention will more fully appear from the following detailed description when the same is read in connection with the accompanying drawing. It is to be expressly understood, however, that the drawing is for purpose of illustration only and is not intended as a definition of the limits of the invention.

BEST MODE OF CARRYING OUT THE INVENTION

EXAMPLE 1

Example 1 according to the present invention is hereinafter specifically described with reference to the drawings.

Figure 1:
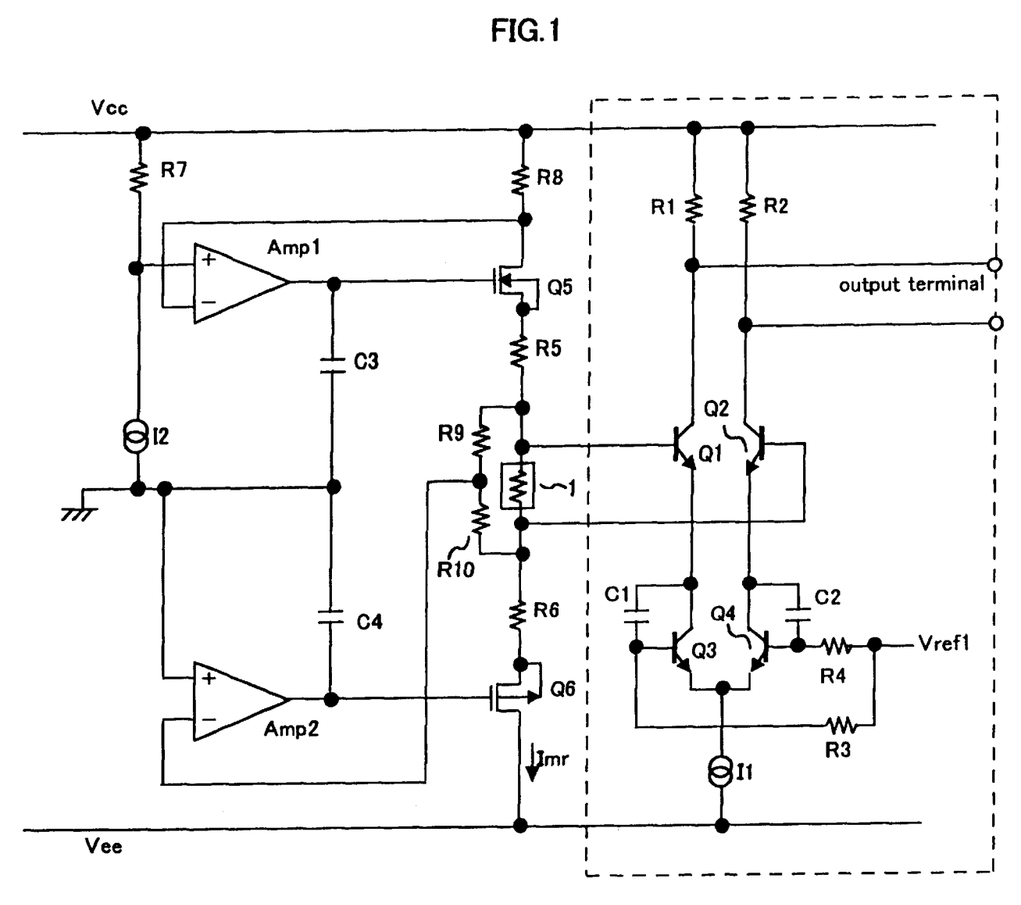
FIG. 1 is a circuit diagram showing a differential amplifier circuit according to example 1 of the present invention.

In FIG. 1, reference numeral 1 indicates a signal source in which an ac voltage signal is superimposed on a dc voltage, and an example specifically applied to a magneto-resistive head (MR device) is shown herein. Two term signals of the signal source 1 are respectively connected to bases of NPN transistors Q1 and Q2 forming a differential input section. Collectors of the NPN transistors Q1 and Q2 are respectively connected to a first voltage source Vcc through resistors R1 and R2, and further connected to output terminals. Emitters of the NPN transistors Q1 and Q2 are respectively connected to collectors of NPN transistors Q3 and Q4, and emitters of the NPN transistors Q3 and Q4 are connected to each other and commonly connected to a second power source Vee through a constant current source I1. Bases of the NPN transistors Q3 and Q4 are respectively connected to a reference voltage source Vref1 through resistors R3 and R4. The collectors and the bases of the NPN transistors Q3 and Q4 are connected through capacitors C1 and C2.

A portion surrounded by the broken line in FIG. 1 shows a differential amplifier circuit section that is an essential part of the invention.

The remaining portion of the circuit is hereinafter described.

One terminal of a resistor R7 is connected to the first voltage source Vcc, and another terminal is grounded through a constant current source I2. Junction between the constant current source I2 and the resistor R7 is connected to a positive input terminal of a transconductance amplifier Amp1, and output of the Amp1 is connected to a gate of a NMOS transistor Q5 and to one terminal of the capacitor C3. Another terminal of the capacitor C3 is grounded, and drain of the NMOS transistor Q5 is connected to the first power source Vcc through a resistor 8. The drain of the NMOS transistor Q5 is connected to a negative input terminal of the transconductance amplifier Amp1. Source of the NMOS transistor Q5 is connected to one terminal of the signal source 1 through a resistor R5. Another terminal of the signal source 1 is connected to a source of a PMOS transistor Q6 through a resistor R6.

Junction between the signal source 1 and the resistor R5 is connected to another terminal of the signal source 1 through resistors R9 and R10 connected in series. The resistors R9 and R10 have an equal resistance value, and junction between the resistors R9 and R10 is connected to a negative input terminal of a transconductance amplifier Amp2. Positive input terminal of the Amp2 is grounded. Output of the transconductance amplifier Amp2 is connected to a gate of the PMOS transistor Q6 and to one terminal of the capacitor C4, and another terminal of the capacitor C4 is grounded. Drain of the PMOS transistor Q6 is connected to the second power source Vee.

Then, operation of the differential amplifier circuit section surrounded by the broken line is hereinafter described.

In FIG. 1, as the collector and the base of the NPN transistor Q3 are connected through the capacitor C1, the base ac voltage is equal to the collector ac voltage of the NPN transistor Q3. And the NPN transistor Q3 operates in the same manner as a diode in view of ac. The same operation is performed also in the NPN transistor Q4 forming a pair with the NPN transistor Q3.

By the operation of the capacitors C1 and C2, dc currents of the respective collectors of the NPN transistor Q1, Q2, Q3 and Q4 are substantially the same, and the dc current component at the two terminals of the signal source 1 is removed by the capacitors C1 and C2. As a result, only the ac component generated at the two terminals of the signal source 1 is amplified in the NPN transistors Q1 and Q2. Further, the signal including the ac component amplified in the NPN transistors Q1 and Q2 is outputted from the output terminals of the collectors of the NPN transistors Q1 and Q2 in the form of a differential signal.

Then, it is hereinafter described that the capacitors arranged according to the invention can be incorporated in a semiconductor integrated circuit.

Figure 2:
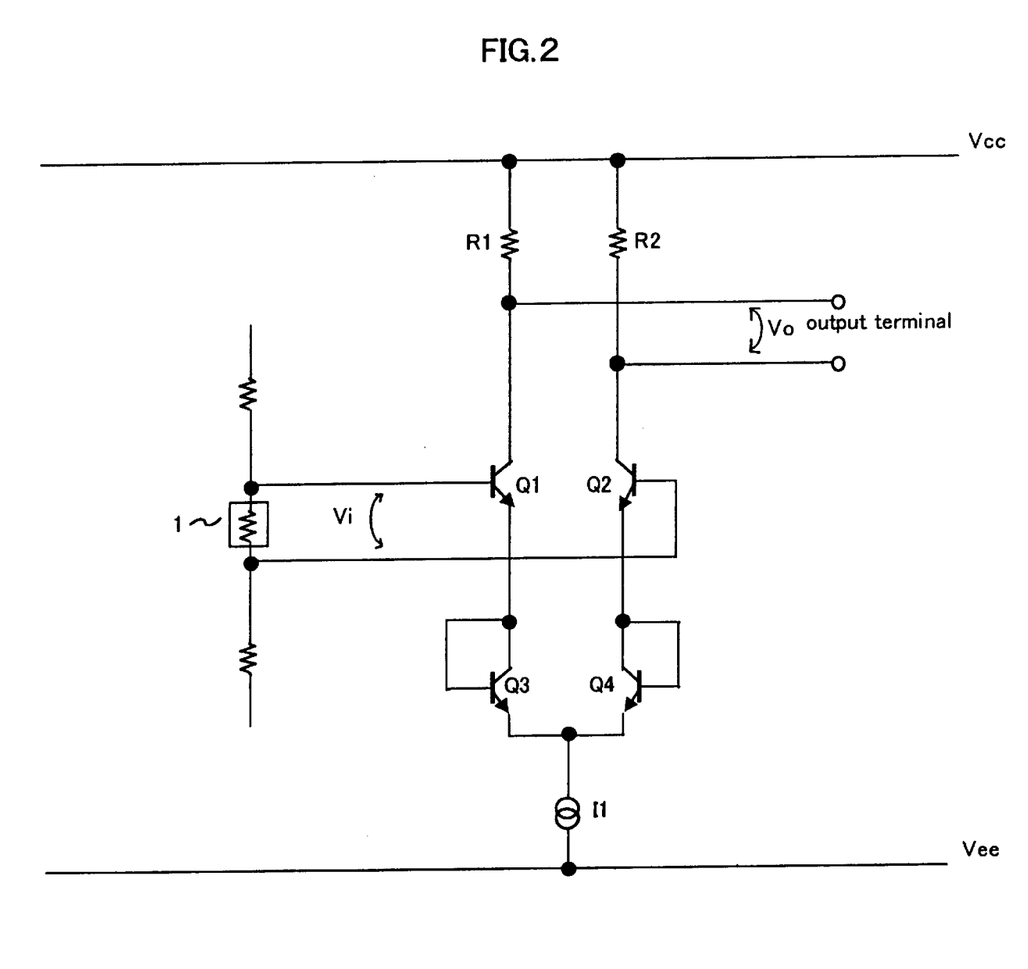
FIG. 2 is a circuit diagram to explain the operation of the differential amplifier circuit according to example 1 of the invention.

FIG. 2 shows a circuit equivalent to the portion surrounded by the broken line in FIG. 1 in view of ac. Supposing that transconductances of the NPN transistors Q1, Q2, Q3 and Q4 are respectively gm1, gm2, gm3 and gm4, these gm1, gm2, gm3 and gm4 can be shown by the following expressions (1) to (4):

$$gm1=(I1/2)/(q/kT) \quad \text{expression (1)}$$

$$gm2=(I1/2)/(q/kT) \quad \text{expression (2)}$$

$$gm3=(I1/2)/(q/kT) \quad \text{expression (3)}$$

$$gm4=(I1/2)/(q/kT) \quad \text{expression (4)}$$

where: k=Boltzman's constant, T=absolute temperature and q=quantity of electric charge.

Supposing that the differential base input voltage of the NPN transistors Q1 and Q2 is Vi and that the differential voltage output between the collectors of the NPN transistors Q1 and Q2 is Vo, a voltage gain AV of the differential amplifier circuit including the NPN transistors Q1 and Q2 can be shown by the following expression:

$$AV=Vo/Vi=(R1+R2)/(1/gm1+1/gm2+1/gm3+1/gm4) \quad \text{expression (5)}$$

Supposing that I1 is 10 mA, hFE of the NPN transistors Q3 and Q4 is 100, and R3=R4=6 kΩ, it is calculated that to get a lower limit cutoff frequency of 1 MHz in the amplifier circuit, a value of the capacitors C1 and C2 may be about 90 pF, though a detailed calculation is omitted herein.

As a result, in this example, the capacitors C1 and C2 for removing the dc voltage component of the signal source 1 can be incorporated in the semiconductor integrated circuit. As compared with the conventional circuit shown in FIG. 7, it is not necessary to provide the NPN transistors Q13 and Q14 in the input section of the differential amplifier circuit, and therefore a differential amplifier circuit of less circuit current can be achieved.

Then, operation of the bias current setting circuit section of the signal source 1 is hereinafter described showing an example in which magneto-resistive head is used.

Referring to FIG. 1, setting of bias current can be performed by the constant current source I2. At the two terminals of the resistor R7, a voltage of R7×I2 is generated, and a feedback takes place in the transconductance amplifier Amp1 so that voltage at the two terminals of the resistor R7 and that at the two terminals of the resistor R8 are equal. The current Imr flowing in the resistor R8 can be shown by the following expression:

$$Imr=R7\times I2/R8 \quad \text{expression (6)}$$

Referring to FIG. 1, if a resistance value of resistors R9 and R10 is very large as compared with that of the magneto-resistive head being the signal source 1, it may be considered that Imr is almost equal to the current flowing in the magneto-resistive head. Accordingly, by the mentioned expression (6), the bias current for the magneto-resistive head can be easily set.

Technical advantages of the Resistors R9 and R10 are hereinafter described.

The resistors R9 and R10 are set to an equal value, and midpoint therebetween is connected to the negative input terminal of the transconductance amplifier Amp2, while the positive input terminal of the transconductance amplifier Amp2 being grounded. As a result, a feedback takes place in the transconductance amplifier Amp2 so that potential at the midpoint between the resistors R9 and R10 is equal to the ground voltage. That is, potential at the midpoint of the magneto-resistive head becomes equal to the ground potential.

By employing the above arrangement, even if the magneto-resistive head has short-circuited with the ground potential when it is used as a signal source, there is less possibility of breaking the magneto-resistive head.

EXAMPLE 2

Figure 3:
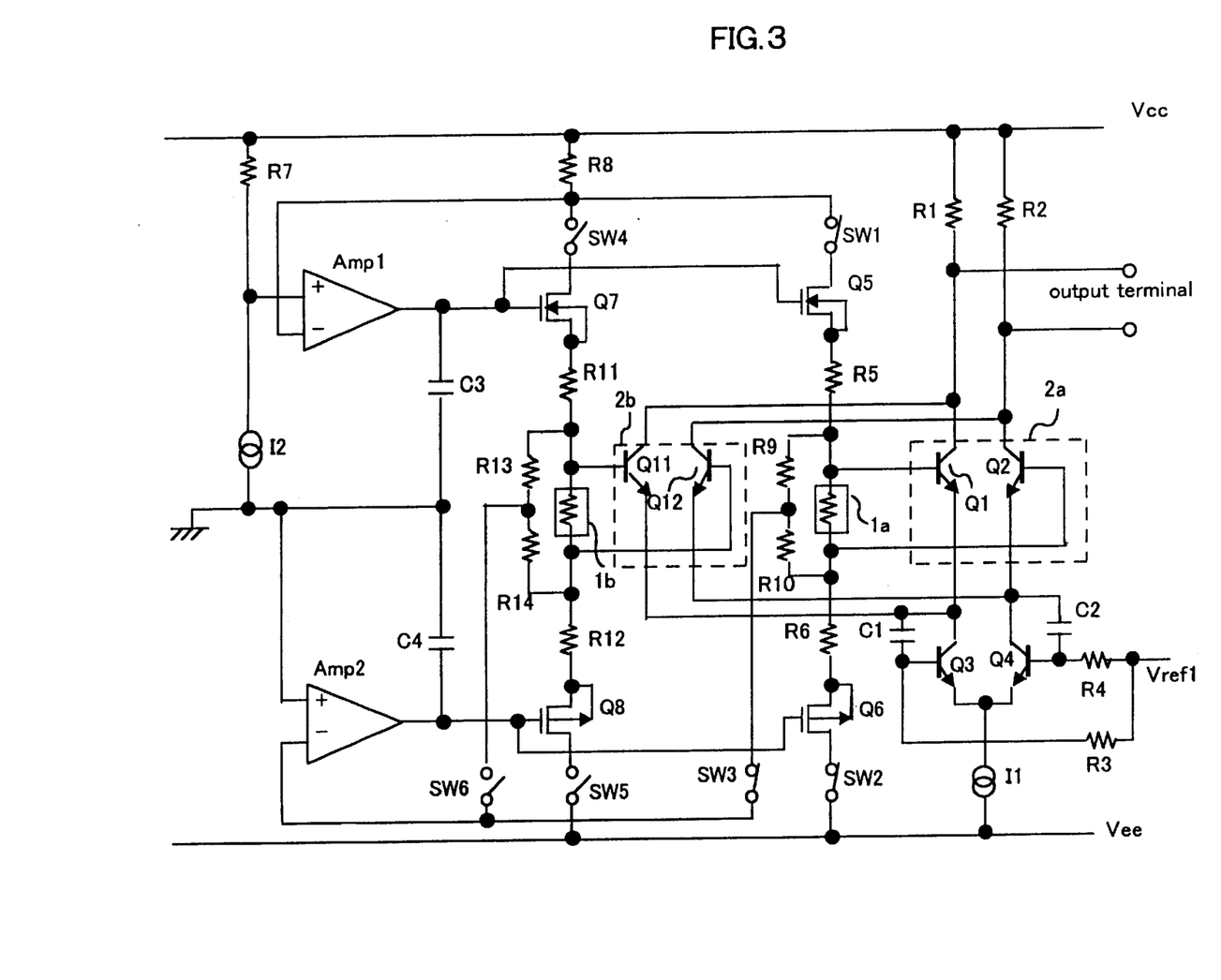
FIG. 3 is a circuit diagram showing a differential amplifier circuit according to example 2 of the invention.

FIG. 3 shows example 2 according to the invention. FIG. 3 is an example of differential amplifier circuit for selecting one of two signals sources of a first signal 1a and a second signal 1b, and amplifying the selected signal.

Note that the same reference numerals are designated to the same elements or other elements performing the same operation as those in FIG. 1.

Referring to FIG. 3, bases of NPN transistors Q11 and Q12 forming a differential input section 2b are respectively connected to two terminals of a second signal source 1b. Collectors of the NPN transistors Q11 and Q12 are respectively connected to collectors of the transistors Q1 and Q2 forming another differential input section 2a. Emitters of Q1 and Q2 are respectively connected to the emitters of the transistors Q1 and Q2.

Switches SW1, SW2 and SW3 and switches SW4, SW5 and SW6 are provided for switching between the signal source 1a and the signal source 1b.

In such an arrangement, when the switches SW1, SW2 and SW3 are on and the switches SW4, SW5 and SW6 are off, a bias current flows in the signal source 1a, and any bias current does not flow in the signal source 1b. As a result, the dc voltage potential at the two terminals of the signal source 1b becomes lower than that at the two terminals of the signal source 1a. Thus, only the ac voltage at the two terminals of the signal source 1a is amplified by the differential amplifier circuit including Q1, Q2, Q3 and Q4.

In the same manner, when the switches Sw1, SW2 and SW3 are off and the switches SW4, SW5 and SW6 are on, any bias current does not flow in the signal source 1a, and a bias current flows in the signal source 1b. In this case, only the ac voltage at the two terminals of the signal source 1b is amplified by the differential amplifier circuit including Q11, Q12, Q3 and Q4.

As described above, a circuit for selecting a specific one signal between two signals and amplifying it can be achieved by a simple arrangement.

If there are not less than three signal sources, by providing not less than three differential input sections and switches for selecting a signal of one signal source among them, it is possible to arrange a circuit for selecting a specific signal source and amplifying the signal.

EXAMPLE 3

Figure 4:
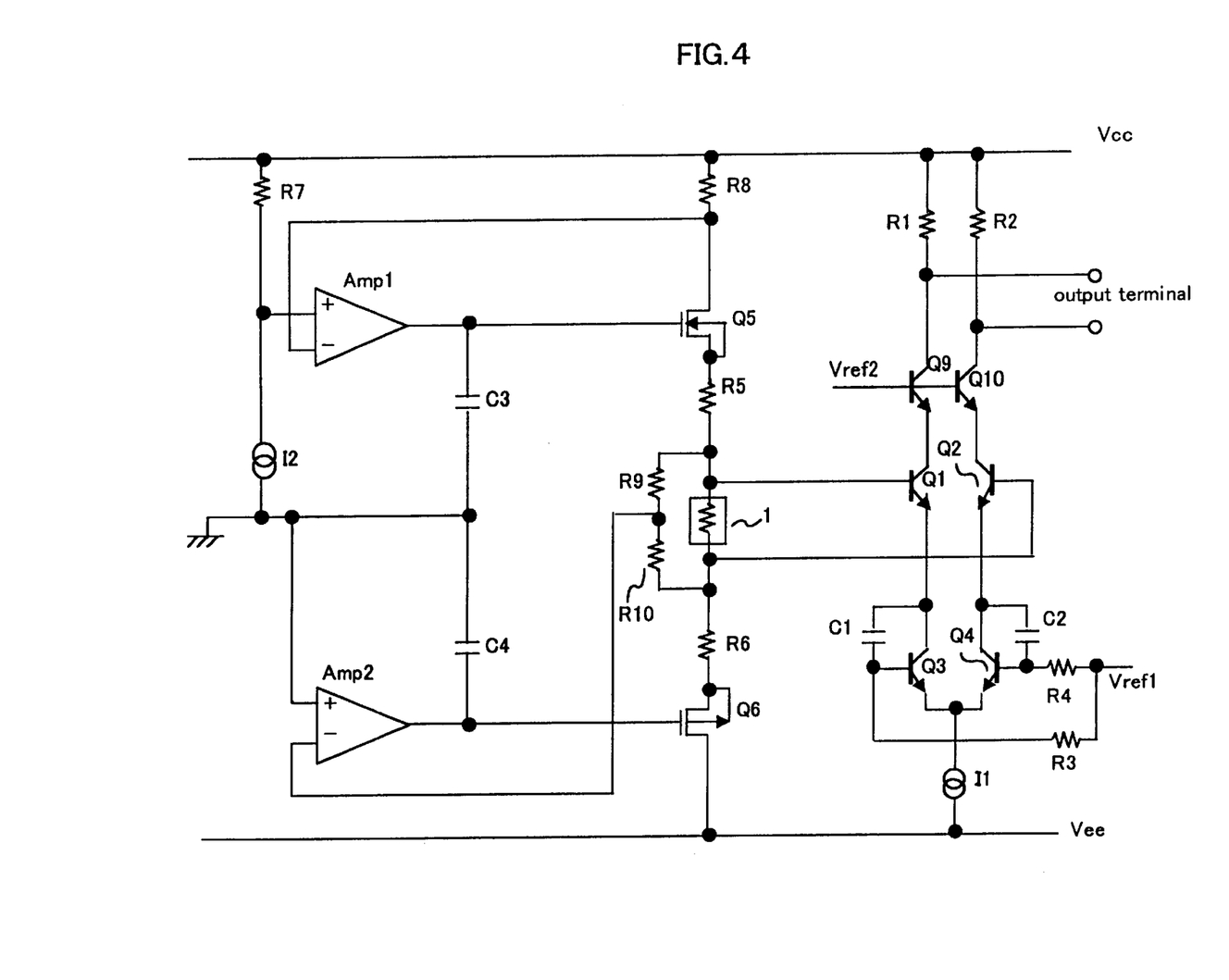
FIG. 4 is a circuit diagram showing a differential amplifier circuit according to example 3 of the invention.

FIG. 4 shows example 3 in which differential amplifier circuit is arranged to improve frequency characteristic in high band.

In the arrangement shown in FIG. 4, as compared with the circuit in FIG. 1, NPN transistors Q9 and Q10 are inserted between respective collectors of the NPN transistors Q1 and Q2 and respective resistors R1 and R2, to improve its high frequency characteristic. Emitters of the NPN transistors Q9 and Q10 are respectively connected to collectors of the NPN transistors Q1 and Q2, and collectors of the NPN transistors Q9 and Q10 are respectively connected to the first voltage source through the resistors R1 and R2, and further connected to the output terminals. Bases of the NPN transistors Q9 and Q10 are respectively connected to a voltage source Vref2.

In the differential amplifier circuit of above arrangement, by the NPN transistors Q9 and Q10, Miller capacity of the NPN transistors Q1 and Q2 is reduced, and frequency characteristic in high band of the differential amplifier circuit is improved.

EXAMPLE 4

Figure 5:
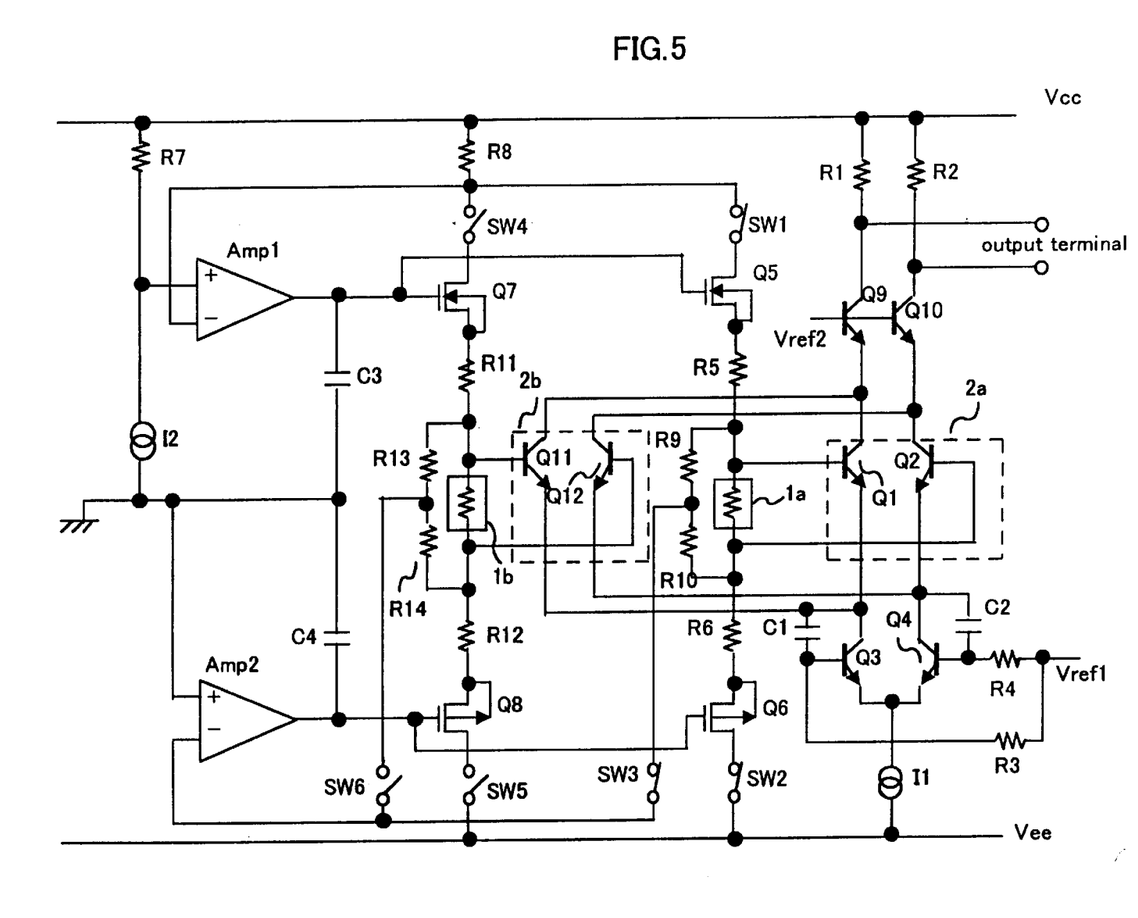
FIG. 5 is a circuit diagram showing a differential amplifier circuit according to example 4 of the invention.

FIG. 5 shows example 4 in which differential amplifier circuit is arranged to be able to select one signal source among plural signal sources and to improve frequency characteristic in high band.

In the arrangement shown in FIG. 5, as compared with the circuit in FIG. 3, NPN transistors Q9 and Q10 are inserted between respective collectors of the NPN transistors Q1 and Q2 and respective resistors R1 and R2 to improve its frequency characteristic in high band likewise the circuit of FIG. 4. When the signal source 1a is selected, Miller capacity between the collectors and bases of the NPN transistors Q1 and Q2 is reduced, and frequency characteristic in high band of the differential amplifier circuit is improved. When the signal source 1b is selected, Miller capacity between the collectors and bases of the NPN transistors Q7 and Q8 is reduced, and frequency characteristic in high band of the differential amplifier circuit is improved.

Even when there are not less than three signal sources, it is possible to arrange a differential amplifier circuit in which frequency characteristic in high band is improved likewise.

As has been described so far, in the differential amplifier circuit according to the invention, two terminals of a signal source are respectively connected to bases of a first NPN transistor and a second NPN transistor; emitters of the first NPN transistor and the second NPN transistor are respectively connected to collectors of a third NPN transistor and a fourth NPN transistor; emitters of the third NPN transistor and the fourth NPN transistor are commonly connected, and further connected to a first power source through a constant current source; the collectors and bases of the third NPN transistor and the fourth NPN transistor are respectively connected through first and second capacitors; bases of the third NPN transistor and the fourth NPN transistor are respectively connected to a first reference power source through first and second resistors; and collectors of the first NPN transistor and the second NPN transistor are respectively connected to a second power source through third and fourth resistors, and respectively connected to output terminal. As a result, a differential amplifier circuit is achieved, in which capacity can be reduced to the extent that the capacitors can be incorporated in the semiconductor integrated circuit, and power consumption can be reduced.

Further, in the differential amplifier circuit according to the invention, the collectors of the first NPN transistor and the second NPN transistor are respectively connected to emitters of fifth NPN transistor and sixth NPN transistor in which a second reference power source is connected to bases; and collectors of the fifth NPN transistor and the sixth NPN transistor are respectively connected to the second power source through the third and fourth resistors, and respectively connected to output terminals. As a result, a differential amplifier circuit is achieved, in which frequency characteristic in high band is improved.

Further, in the differential amplifier circuit according to the invention, a bias circuit having fifth and sixth resistors for applying a bias current to the signal source is formed; one terminal of the fifth resistor and that of the sixth resistor are respectively connected to the two terminals of the signal source; and another terminal of the fifth resistor and that of the six resistor are respectively connected to source terminals of a MOS transistor. As a result, a differential circuit is achieved, in which a bias current can be easily set.

Further, in the differential amplifier circuit according to the invention, seventh and eighth resistors of equal value connected in series are respectively connected to two end of the signal source; and junction between the seventh and eighth resistors is set to a ground potential. As a result, even when a short circuit with the ground potential takes place in the signal source, there is less possibility of breaking the signal source.

Further, a differential amplifier circuit according to the invention includes: plural signal sources; and plural differential input sections formed by connecting two terminals of each signal source respectively to bases of a first NPN transistor and a second NPN transistor in each individual signal source of the plural signal sources; and in which emitters of the plural first NPN transistors and the plural second NPN transistors are commonly connected, and respectively connected to collectors of a third NPN transistor and a fourth NPN transistor; emitters of the third NPN transistor and the fourth NPN transistor are commonly connected, and further connected to a first power source through a constant current source; the collectors and bases of the third NPN transistor and the fourth NPN transistor are respectively connected through first and second capacitors; bases of the third NPN transistor and the fourth NPN transistor are respectively connected to a first reference power source through first and second resistors; and collectors of the plural first NPN transistors and the plural second NPN transistors are commonly connected, and further connected to a second power source through third and fourth resistors, and respectively connected to output terminal. As a result, a differential amplifier circuit can be obtained, in which one of the plural signal sources can be easily selected, capacity of the capacitors can be reduced to the extent that the capacitors can be incorporated in the semiconductor integrated circuit, and power consumption can be reduced.

Further, in the differential amplifier circuit according to the invention, the collectors of the first NPN transistor and the second NPN transistor are commonly connected, and further connected to emitters of fifth NPN transistor and sixth NPN transistor in which a second reference power source is connected to bases; and collectors of the fifth NPN transistor and the sixth NPN transistor are respectively connected to the second power source through third and fourth resistors, and connected to output terminal. As a result, even in the case of plural signal sources, a differential amplifier circuit is achieved, in which frequency characteristic in high bad is improved.

Further, the differential amplifier circuit according to the invention includes plural bias circuits for applying a bias current to the plural signal sources, each of the plural bias circuits having fifth and sixth resistors; in which one terminal of the fifth resistor and that of the sixth resistor are respectively connected to the two terminals of the plural signal sources; source terminals of a MOS transistor are respectively connected to another terminal of the fifth resistor and that of the sixth resistor; and in the MOS transistor, switches for selecting one of the plural signals are connected to drain terminals thereof. As a result, a differential circuit is achieved, in which a bias current can be easily set even in the case of plural signal sources.

Further, in the differential amplifier circuit according to the invention, seventh and eighth resistors of equal value connected in series are respectively connected to two end of each of plural signal source; and junction between the seventh and eighth resistors is set to a ground potential. As a result, a differential amplifier circuit is achieved, in which even when a short circuit with the ground potential takes place in the signal source, there is less possibility of breaking the signal source even in the case of plural signals.

Further, in the differential amplifier circuit according to the invention, the signal source is composed of a magneto-resistive head. As a result, a differential amplifier circuit of magneto-resistive head signal is achieved, in which capacity of the capacitors can be reduced to the extent that the capacitors can be incorporated in the semiconductor integrated circuit, and power consumption can be reduced.

What is claimed is:

1. A differential amplifier circuit for treating a signal in which an ac voltage signal is superimposed on a dc voltage, wherein:
    two terminals of a signal source are respectively connected to bases of a first NPN transistor and a second NPN transistor;
    emitters of said first NPN transistor and said second NPN transistor are respectively connected to collectors of a third NPN transistor and a fourth NPN transistor;
    emitters of said third NPN transistor and said fourth NPN transistor are commonly connected, and further connected to a first power source through a constant current source;
    the collectors and bases of said third NPN transistor and said fourth NPN transistor are respectively connected through first and second capacitors;
    the bases of said third NPN transistor and said fourth NPN transistor are respectively connected to a first reference power source through first and second resistors; and
    collectors of said first NPN transistor and said second NPN transistor are respectively connected to a second power source through third and fourth resistors, and respectively connected to output terminal.

2. The differential amplifier circuit according to claim 1, wherein said signal source is composed of a magneto-resistive head.

3. The differential amplifier circuit according to claim 1, wherein
    the collectors of said first NPN transistor and said second NPN transistor are respectively connected to emitters of fifth NPN transistor and sixth NPN transistor in which a second reference power source is connected to bases; and
    collectors of said fifth NPN transistor and said sixth NPN transistor are respectively connected to the second power source through said third and said fourth resistors, and respectively connected to output terminal.

4. The differential amplifier circuit according to claim 3, wherein said signal source is composed of a magneto-resistive head.

5. The differential amplifier circuit according to claim 1, further comprising a bias circuit having fifth and sixth resistors for applying a bias current to said signal source is formed; wherein
    one terminal of said fifth resistor and that of said sixth resistor are respectively connected to the two terminals of said signal source; and
    another terminal of said fifth resistor and that of said six resistor are respectively connected to source terminals of a MOS transistor.

6. The differential amplifier circuit according to claim 5, wherein the signal source is composed of a magneto-resistive head.

7. The differential amplifier circuit according to claim 1, wherein seventh and eighth resistors of equal value connected in series are respectively connected to two end of the signal source; and junction between the seventh and eighth resistors is set to a ground potential.

8. The differential amplifier circuit according to claim 7, wherein said signal source is composed of a magneto-resistive head.

9. A differential amplifier circuit for treating a signal in which an ac voltage signal is superimposed on a dc voltage, comprising plural signal sources, and plural differential input sections formed by connecting two terminals of each signal source respectively to bases of a first NPN transistor and a second NPN transistor in each individual signal source of the plural signal sources; and wherein
    emitters of said plural first NPN transistors and said plural second NPN transistors are commonly connected, and respectively connected to collectors of a third NPN transistor and a fourth NPN transistor;
    emitters of said third NPN transistor and said fourth NPN transistor are commonly connected, and further connected to a first power source through a constant current source;
    the collectors and bases of said third NPN transistor and said fourth NPN transistor are respectively connected through first and second capacitors;
    the bases of said third NPN transistor and said fourth NPN transistor are respectively connected to a first reference power source through first and second resistors; and
    collectors of said plural first NPN transistors and said plural second NPN transistors are commonly connected and further connected to a second power source through third and fourth resistors, and respectively connected to output terminal.

10. The differential amplifier circuit according to claim 9, wherein said signal source is composed of a magneto-resistive head.

11. The differential amplifier circuit according to claim 9, wherein
    the collectors of said first NPN transistor and said second NPN transistor are commonly connected, and further connected to emitters of fifth NPN transistor and sixth NPN transistor in which a second reference power source is connected to bases; and
    collectors of said fifth NPN transistor and said sixth NPN transistor are respectively connected to the second power source through third and fourth resistors, and connected to output terminal.

12. The differential amplifier circuit according to claim 11, wherein said signal source is composed of a magneto-resistive head.

13. The differential amplifier circuit according to claim 9, further comprising plural bias circuits for applying a bias current to the plural signal sources, each of said plural bias circuits having fifth and sixth resistors; wherein
    one terminal of said fifth resistor and that of said sixth resistor are respectively connected to the two terminals of said plural signal sources;
    source terminals of a MOS transistor are respectively connected to another terminal of said fifth resistor and that of said sixth resistor; and
    in the MOS transistor, switches for selecting one of said plural signals are connected to drain terminals thereof.

14. The differential amplifier circuit according to claim 13, wherein said signal source is composed of a magneto-resistive head.

15. The differential amplifier circuit according to claim 9, wherein seventh and eighth resistors of equal value connected in series are respectively connected to two end of each of said plural signal source; and junction between said seventh and said eighth resistors is set to a ground potential.

16. The differential amplifier circuit according to claim 15, wherein said signal source is composed of a magneto-resistive head.

* * * * *